(12) United States Patent
Mihara et al.

(10) Patent No.: US 8,920,596 B2
(45) Date of Patent: Dec. 30, 2014

(54) PLASMA PROCESSING APPARATUS

(75) Inventors: Naoki Mihara, Amagasaki (JP); Naoki Matsumoto, Amagasaki (JP); Jun Yoshikawa, Amagasaki (JP); Kazuo Murakami, Amagasaki (JP)

(73) Assignee: Tokyo Electron Limited (JP)

( * ) Notice: Subject to any disclaimer, the term of this patent is extended or adjusted under 35 U.S.C. 154(b) by 770 days.

(21) Appl. No.: 12/862,915

(22) Filed: Aug. 25, 2010

(65) Prior Publication Data

US 2011/0048642 A1 Mar. 3, 2011

(30) Foreign Application Priority Data

Sep. 2, 2009 (JP) ................................. 2009-202634

(51) Int. Cl.
*H01L 21/3065* (2006.01)
*H01J 37/32* (2006.01)

(52) U.S. Cl.
CPC ....... *H01J 37/32192* (2013.01); *H01J 37/3244* (2013.01); *H01J 37/32449* (2013.01)
USPC .................. 156/345.34; 156/345.33

(58) Field of Classification Search
CPC ..................... H01J 37/32192; H01J 37/32449; C23C 16/511
USPC .......... 118/723 MW; 156/345.33–34
See application file for complete search history.

(56) References Cited

U.S. PATENT DOCUMENTS

| | | | | |
|---|---|---|---|---|
| 5,342,472 A | * | 8/1994 | Imahashi et al. | 156/345.42 |
| 5,589,002 A | * | 12/1996 | Su | 118/723 E |
| 5,643,394 A | * | 7/1997 | Maydan et al. | 156/345.33 |
| 6,027,606 A | * | 2/2000 | Mohn et al. | 156/345.34 |
| 6,043,004 A | * | 3/2000 | Kurimoto | 430/329 |
| 6,433,298 B1 | * | 8/2002 | Ishii | 219/121.43 |
| 6,845,734 B2 | * | 1/2005 | Carpenter et al. | 118/723 MW |
| 7,220,497 B2 | * | 5/2007 | Chang | 428/701 |
| 2001/0015175 A1 | * | 8/2001 | Masuda et al. | 118/723 R |
| 2002/0000196 A1 | * | 1/2002 | Park | 118/715 |
| 2002/0007790 A1 | | 1/2002 | Park | |
| 2005/0255257 A1 | * | 11/2005 | Choi et al. | 427/585 |
| 2007/0128864 A1 | * | 6/2007 | Ma et al. | 438/680 |
| 2008/0282979 A1 | * | 11/2008 | Chen et al. | 118/722 |
| 2008/0308134 A1 | * | 12/2008 | Maeda et al. | 134/137 |

FOREIGN PATENT DOCUMENTS

| | | |
|---|---|---|
| JP | 04316325 | 11/1992 |
| JP | 08055840 | 2/1996 |
| JP | 08288266 | 11/1996 |
| JP | 09186140 | 7/1997 |
| JP | 09283499 | 10/1997 |
| JP | 2002053963 | 2/2002 |
| JP | 2009-099807 | 5/2009 |

\* cited by examiner

*Primary Examiner* — Keath Chen
*Assistant Examiner* — Aiden Lee
(74) *Attorney, Agent, or Firm* — Cantor Colburn LLP

(57) ABSTRACT

In a plasma processing apparatus for processing a substrate by plasmatizing a process gas introduced into a processing container, an introducing unit which introduces the process gas is formed on a ceiling surface of the processing container; a gas retention portion which gathers the process gas supplied from the outside of the processing container through a supply passage, and a plurality of gas ejection holes which allow communication between the gas retention portion and the inside of the processing container are formed in the introducing unit; a gas ejection hole is not formed in a location of the gas retention portion that faces an opening of the supply passage; and a cross section of each of the gas ejection holes has a flat shape.

8 Claims, 10 Drawing Sheets

PLASMA PROCESSING APPARATUS

CROSS-REFERENCE TO RELATED PATENT APPLICATIONS

This application claims the benefit of Japanese Patent Application No. 2009-202634, filed on Sep. 2, 2009, in the Japan Patent Office, the disclosure of which is incorporated herein in its entirety by reference.

BACKGROUND OF THE INVENTION

1. Field of the Invention

The present invention relates to a plasma processing apparatus used in semiconductor manufacturing.

2. Description of the Related Art

Plasma processing apparatuses that generate plasma by propagating microwaves from slots formed in a Radial Line Slot Plate (Radial Line Slot Antenna: RLSA) into a processing container are conventionally used in the manufacturing field of semiconductor devices (for example, refer to Patent Document 1). These RLSA-type plasma processing apparatuses are capable of forming uniform plasma having high density and a low electron temperature, and performing plasma-process of large-sized semiconductor wafers uniformly and fast. A well-known example of the plasma process is a process of etching a surface of a substrate by using a CF-based gas or a CFH-based gas.

In the plasma processing apparatuses, the microwaves are propagated into the processing container through a dielectric material disposed on a ceiling surface of the processing container. Then, a process gas introduced to the processing container is plasmatized by energy of the microwaves, and thus etching is performed on the surface of the substrate. Generally, an introducing unit for introducing the process gas to the processing container is disposed, for example, on a side surface of the processing container. Also recently, in addition to the introducing unit disposed on the side surface of the processing container, an introducing unit for introducing the process gas is formed on the ceiling surface of the processing container. Accordingly, improvement in the uniformity of etching on the surface of the substrate (Radial Distribution Control (RDC)) is obtained by optimizing a ratio of an amount of a process gas introduced from the introducing unit on the side surface to an amount of a process gas introduced from the introducing unit on the ceiling surface.

(Patent Document 1) Japanese Laid-Open Patent Publication No. 2009-99807

However, in a conventional plasma processing apparatus, a carbon-based product may be generated and adhered to an introducing unit for introducing a process gas to a processing container. Also, the process gas may be unable to be smoothly introduced to the processing container as a gas ejection hole formed in the introducing unit is blocked by the adhered product. When the gas ejection hole is blocked by the adhered product, a balance between the amounts of process gases introduced from an introducing unit on a side surface and an introducing unit on a ceiling surface may change, and thus etching uniformity over a surface of a substrate may deteriorate. Moreover, an operation of solving a blocking of the gas ejection hole is troublesome, and thus maintenanceability is deteriorated.

SUMMARY OF THE INVENTION

To solve the above and/or other problems, the present invention provides suppression of generation and adhesion of a carbon-based product in an introducing unit for introducing a process gas to a processing container.

According to an aspect of the present invention, there is provided a plasma processing apparatus which processes a substrate by plasmatizing a process gas introduced into a processing container, wherein an introducing unit which introduces the process gas is formed on a ceiling surface of the processing container; a gas retention portion in which the process gas supplied from the outside of the processing container via a supply passage stays tentatively before being distributed, and a plurality of gas ejection holes which allow communication between the gas retention portion and the inside of the processing container are formed in the introducing unit; a gas ejection hole is not formed in a location of the gas retention portion that faces an opening of the supply passage; and a cross section of each of the gas ejection holes has a flat shape.

In the gas retention portion, a recess portion accommodating the process gas supplied from the supply passage to the gas retention portion may be formed in the location of the gas retention portion that faces the opening of the supply passage. In this case, the opening of the supply passage may be located, for example, in the center of the gas retention portion, and the plurality of gas ejection holes may be disposed in a circumferential direction having the opening of the supply passage in a center. Also, each of the gas ejection holes may have a flat cross-sectional shape that is long in the circumferential direction having the opening of the supply passage in a center and short in a radial direction having the opening of the supply passage in a center. Also, the gas ejection holes may be formed in an injector block formed of, for example, a conductive material, and the injector block may be electrically grounded. In this case, a protective film which increases removability for adhered product may be formed on a surface of the injector block that faces the inside of the processing container. Also, a periphery of the opening of the gas ejection hole that faces the inside of the processing container may have a tapered shape. Also, a dielectric window, which is disposed on a ceiling portion of the container as a ceiling member, is shaped tapered inwardly so that the gas ejection holes are not directly seen by being shaded by the dielectric window when viewed upward from the inside of the processing container.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
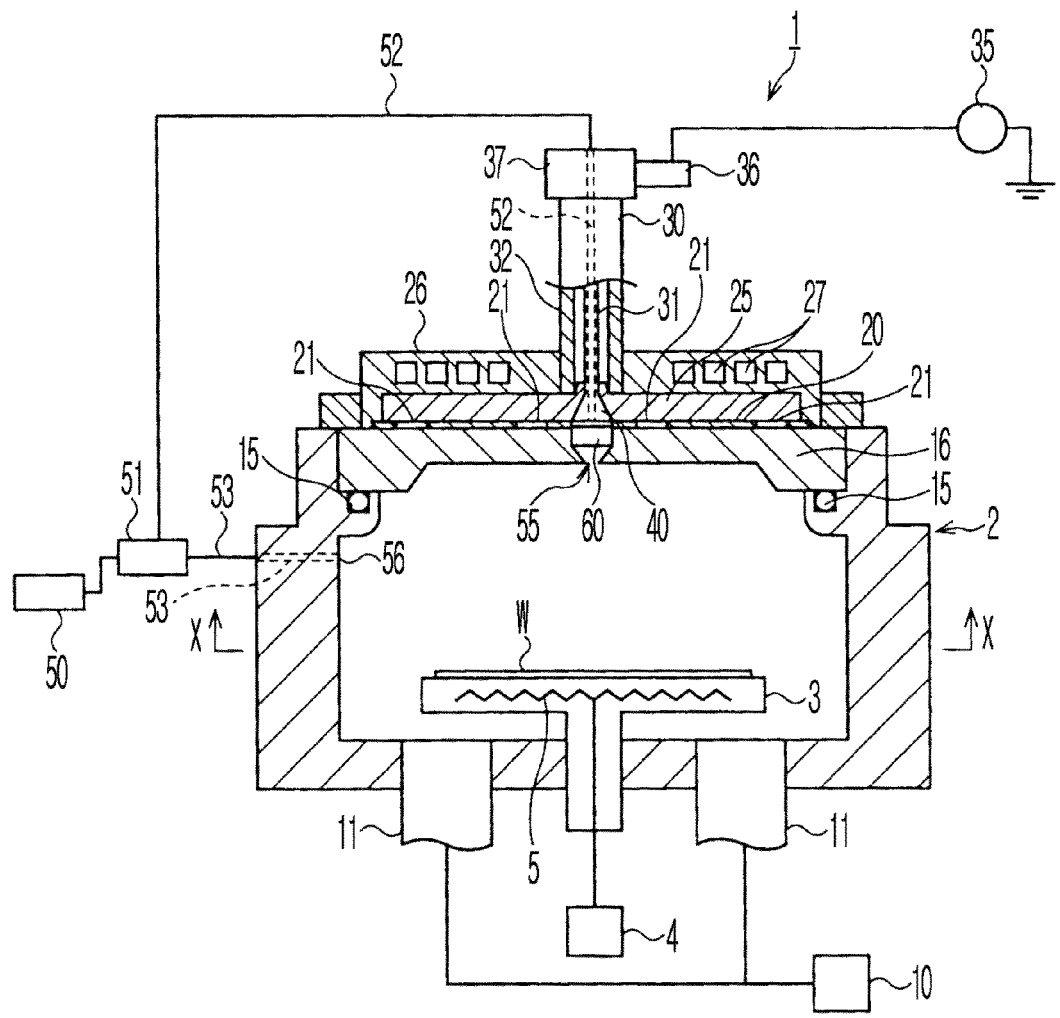
FIG. 1 is a longitudinal-sectional view showing a schematic configuration of a plasma processing apparatus according to an embodiment of the present invention.

Hereinafter, embodiments of the present invention will be described in details with reference to the attached drawings. Like reference numerals denotes like elements throughout and redundant descriptions will be omitted.

As shown in FIG. 1, a plasma processing apparatus 1 includes a processing container 2 having a cylindrical shape. An upper portion of the processing container 2 is opened, and a lower portion of the processing container 2 is closed. The processing container 2 is formed of, for example, aluminum, and is electrically grounded. An inner wall surface of the processing container 2 is coated with a protective film, for example, alumina or the like.

A susceptor 3, which functions as a holding stage for holding a substrate, for example, a semiconductor wafer (hereinafter, referred to as a wafer) W, is formed in the lower portion of the processing container 2. The susceptor 3 is formed of, for example, aluminum, and a heater 5 that emits heat by applying power from an external power source 4 is formed inside the susceptor 3. The wafer W on the susceptor 3 may be heated to a predetermined temperature by the heater 5.

An exhaust pipe 11 through which the inside atmosphere of the processing container 2 is exhausted by an exhauster 10, such as a vacuum pump or the like, is coupled to the lower portion of the processing container 2.

Figure 2:
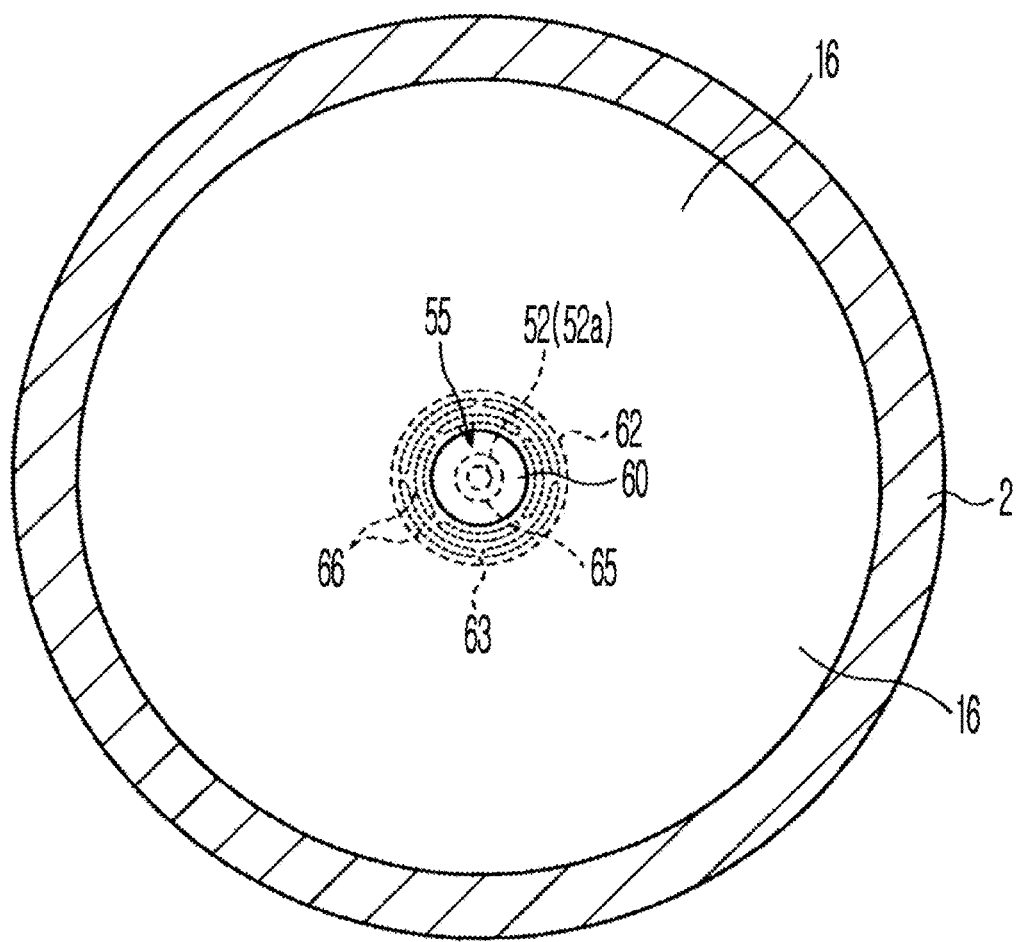
FIG. 2 is a cross-sectional view taken along line X-X of FIG. 1, and shows a state of a lower surface of a dielectric window.

A dielectric window 16 formed of a dielectric material, for example, quartz or the like, is disposed in the upper portion of the processing container 2 through a sealing member 15, such as an O ring or the like, for obtaining air-tightness. As shown in FIG. 2, the dielectric window 16 is approximately disc-shaped. Other dielectric materials, for example, ceramics such as $Al_2O_3$, AlN, or the like, instead of quartz may also be used to form the dielectric window 16.

A planar slot plate, for example, a radial line slot plate 20 having a disc shape, is formed above the dielectric window 16. The radial line slot plate 20 is formed of a thin copper disc plated or coated with a conductive material, for example, Ag, Au, or the like. In the radial line slot plate 20, a plurality of slots 21 are disposed in shape of a plurality of concentric circles.

A dielectric plate 25 for shortening a wavelength of microwaves is disposed on an upper surface of the radial line slot plate 20. The dielectric plate 25 is formed of a dielectric material, for example, $Al_2O_3$ or the like. Instead of $Al_2O_3$, other dielectric materials, for example, ceramics such as quartz, AlN, or the like, may be used for the dielectric plate 25. The dielectric plate 25 is covered with a cover 26 that is conductive, heat medium passages 27, each having an annular shape, are formed in the cover 26, and heat media flowing through the heat medium passages 27 allow the cover 26 and the dielectric window 16 to maintain a predetermined temperature.

A coaxial waveguide 30 is connected to a center of the cover 26. The coaxial waveguide 30 includes an inner conductor 31 and an outer conductor 32. The inner conductor 31 penetrates a center of the dielectric plate 25 and is then connected to a center of the upper surface of the radial line slot plate 20 described above. The plurality of slots 21 formed in the radial line slot plate 20 are all arranged on a plurality of circumferences around the inner conductor 31.

A microwave supply device 35 is connected to the coaxial waveguide 30 via a rectangular waveguide 36 and a mode converter 37. Microwaves of 2.45 GHz, for example, generated in the microwave supply device 35 are emitted to the dielectric window 16 via the rectangular waveguide 36, the mode converter 37, the coaxial waveguide 30, the dielectric plate 25, and the radial line slot plate 20. Also, an electric field is formed on the lower surface of the dielectric window 16 by the microwaves at that time, and thus plasma is generated in the processing container 2.

A lower end 40 of the inner conductor 31 connected to the radial line slot plate 20 is formed in a truncated cone shape. As such, since the lower end 40 of the inner conductor 31 is formed in a truncated cone shape, microwaves are efficiently propagated from the coaxial waveguide 30 to the dielectric plate 25 and the radial line slot plate 20.

A process gas supplied from a gas supply source 50 is distributed by a splitter 51, and is introduced into the processing container 2 through two supply passages 52 and 53. A plasma generation gas, such as nitrogen, Ar, oxygen, or the like, a source gas such as a CF-based gas or a CFH-based gas, and the like are used as the process gas.

Introducing units 55 and 56 for introducing the process gas are disposed on a ceiling surface and an inner side surface in the processing container 2. The introducing unit 55 on the ceiling surface is disposed in a center of the ceiling surface of the processing container 2. The introducing unit 55 on the ceiling surface is connected to one supply passage 52 penetrating the inner conductor 31 of the coaxial waveguide 30.

A plurality of the introducing units 56 on the inner side surface of the processing container 2 are distributed in a circumferential direction of the inner side surface of the processing container 2 so as to surround an area above the wafer W loaded on the susceptor 3. The introducing unit 56 on the inner side surface of the processing container 2 is connected to the other supply passage 53 penetrating the side surface of the processing container 2. The process gas distributed by the splitter 51 is introduced into the processing container 2 from the two introducing units 55 and 56 through the supply passages 52 and 53.

Figure 3:
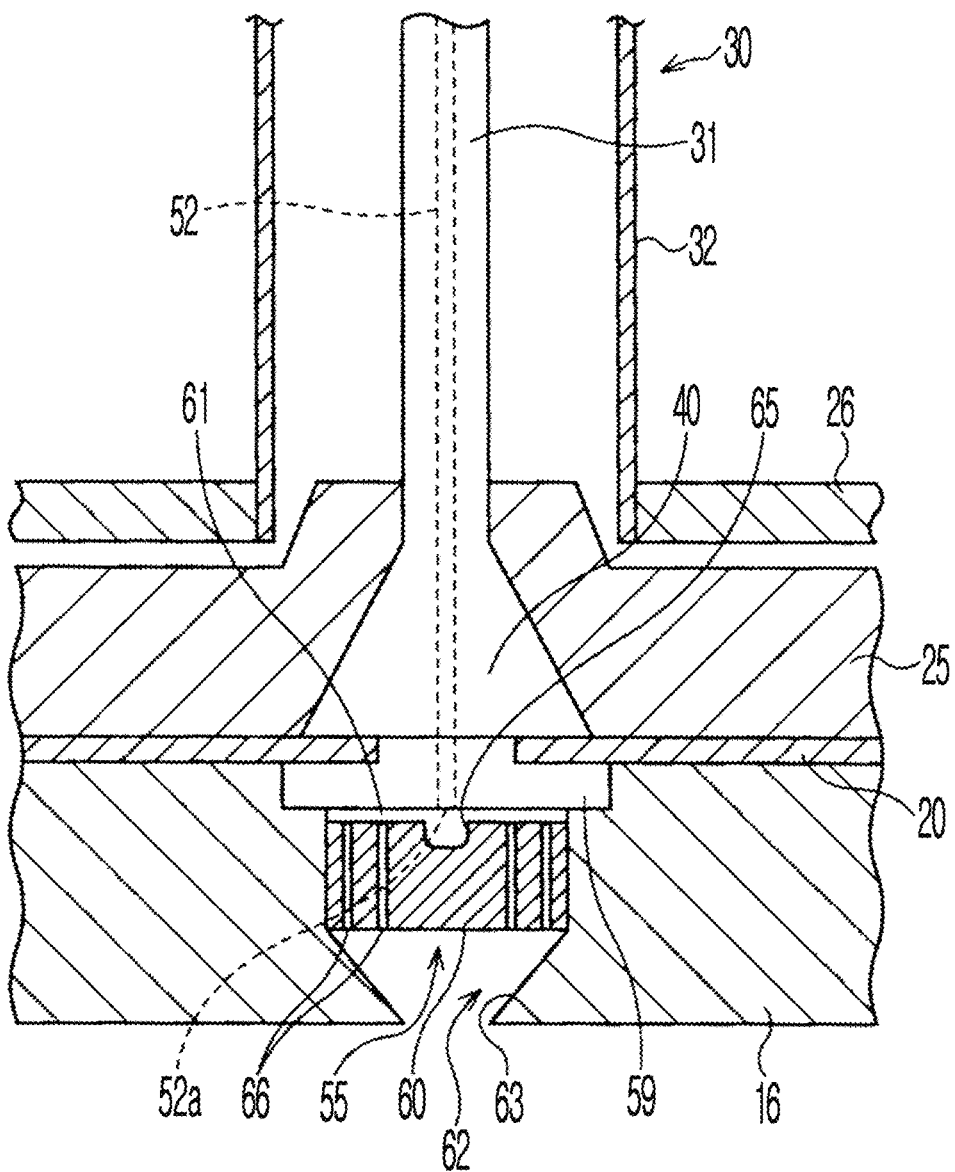
FIG. 3 is a magnified sectional view of an introducing unit for introducing a process gas, which is formed on a ceiling surface of a processing container.

As shown in FIG. 3, the introducing unit 55 on the ceiling surface is constructed by leaving a gap from the lower surface of the inner conductor 31 of the coaxial waveguide 30 and disposing an injector block 60 having a cylindrical shape in the gap. The injector block 60 is formed of a conductive material, for example, aluminum or the like, and is electrically grounded. A supporting block 59 is attached to the lower end surface of the inner conductor 31 while leaving a suitable gap from an upper surface of the injector block 60. The radial line slot plate 20 is supported between the supporting block 59 and the lower end surface of the inner conductor 31. An opening 52a of the supply passage 52 penetrating the centers of the inner conductor 31 and the supporting block 59 is located in the center of the lower surface of the supporting block 59. Cylinder-shaped gas retention portion 61 in which the opening 52a locates in the center is formed between the lower surface of the supporting block 59 and the upper surface of the injector block 60.

A supporting portion 62 for supporting the injector block 60 is disposed in the center of the dielectric window 16. An upper portion of the supporting portion 62 is a cylindrical shaped space having a size capable of receiving the injector block 60. A tapered surface 63 having a cone shape with a diameter narrowing in downward direction is formed in a lower portion of the supporting portion 62.

A recess portion 65 that accommodates the process gas supplied from the opening 52a at the lower surface center of the inner conductor 31 to the gas retention portion 61 is formed in the center of the upper surface of the injector block 60. The recess portion 65 is disposed facing the opening 52a of the supply passage 52.

Figure 4:
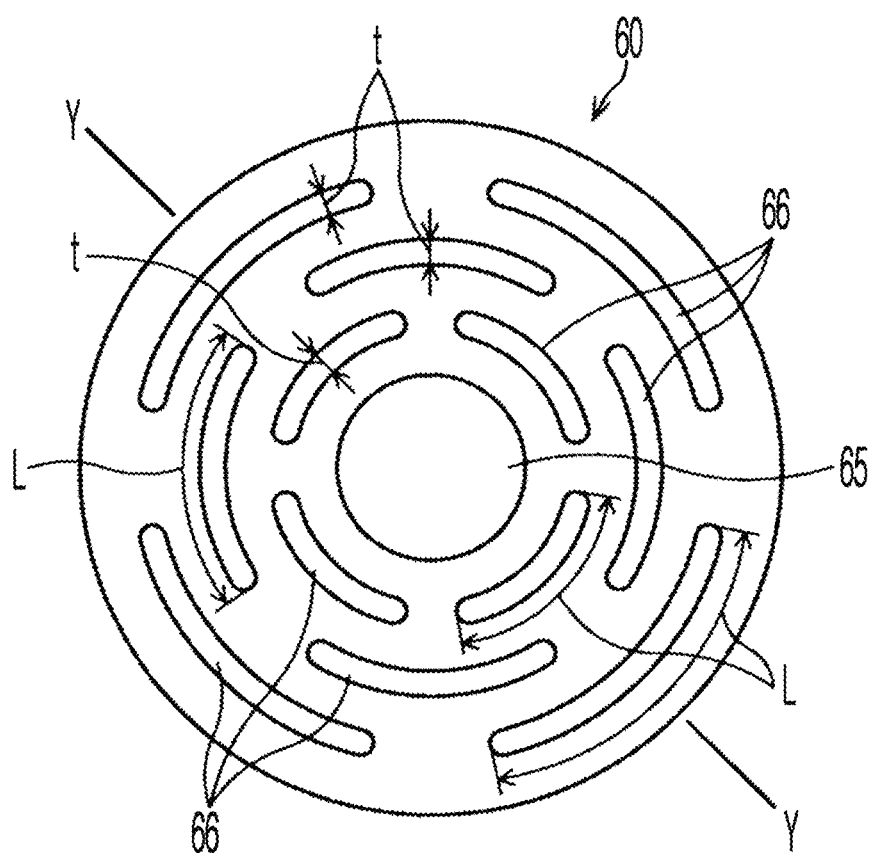
FIG. 4 is a plan view of an injector member attached to an introducing unit for introducing a process gas.
Figure 5:
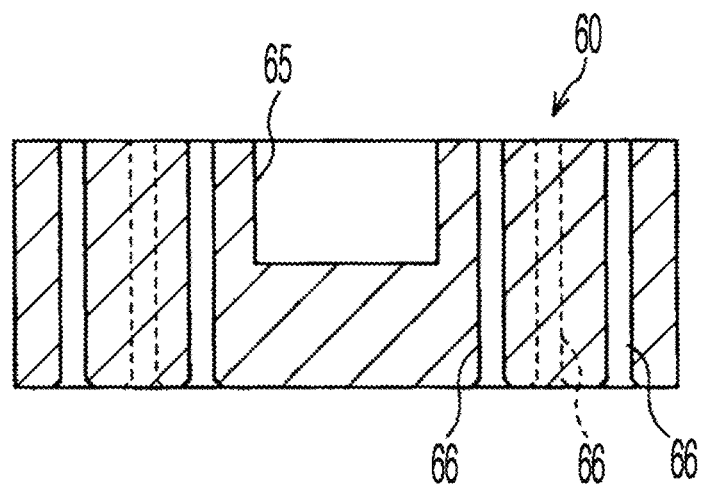
FIG. 5 is a cross-sectional view of an injector member taken along line Y-Y of FIG. 4.

As shown in FIGS. 4 and 5, a plurality of gas ejection holes 66 allowing communication between the gas retention portion 61 and the inside of the processing container 2 are formed in the injector block 60. No gas ejection holes 66 are formed on a location facing the opening 52a of the lower surface center of the inner conductor 31 (the lower surface center of the supporting block 59), and the plurality of gas ejection holes 66 are all disposed to surround the recess portion 65.

All of the gas ejection holes 66 have a flat cross-sectional shape that is long in the circumferential direction having the recess portion 65 in a center and short in the radial direction having the recess portion 65 in a center. Considering a mean free path of electrons and conductance of the gas, the gas ejection hole 66 may have a width t of the radial direction that is, for example, 1 mm or less (preferably from about 0.3 to about 0.5 mm), and a length L of the circumference direction that is, for example, from about several mm to about ten and several mm. In the shown example, a plurality of gas ejection holes 66 are disposed along three concentric circumferences around the recess portion 65.

Since the lower portion of the supporting portion 62 supporting the injector block 60 is the tapered surface 63 having a cone shape, the gas ejection holes 66 are not directly seen by being covered by the dielectric window 16 when viewed upward from the inside of the processing container 2, as shown in FIG. 2.

Figure 6:
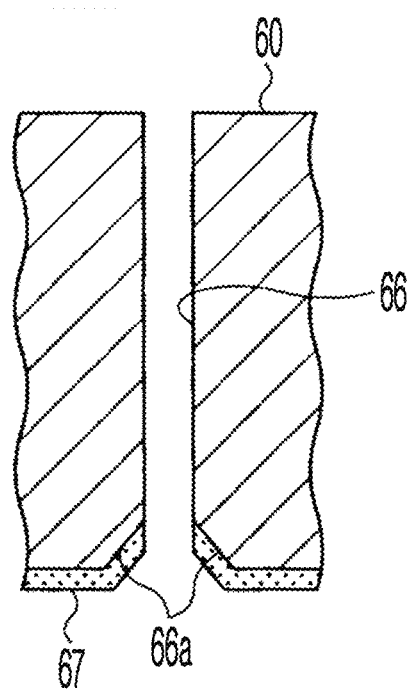
FIG. 6 is a magnified view of a gas ejection hole.

As shown in FIG. 6, a protective film 67 against a gas is formed on the lower surface of the injector block 60. The protective film 67 is formed of, for example, yttria or the like. A periphery 66a of the opening of the gas ejection hole 66 shown in the lower surface of the injector block 60 has a tapered shape. The protective film 67 is also formed on the periphery 66a of the opening of the gas ejection hole 66, which is formed in the taper-shaped portion.

An operation of the plasma processing apparatus 1 having the above-described structure will now be described. Etching of a surface of the wafer W by using the process gas including the plasma generation gas, such as Ar, oxygen, or the like, and the source gas, such as the CF-based gas, the CFH-based gas, or the like, will be described as an example of plasma processing.

As shown in FIG. 1, in the plasma processing apparatus 1, the wafer W is transferred to the processing container 2 and loaded on the susceptor 3. Exhaust through the exhaust pipe 11 is performed, and thus the inside of the processing container 2 is depressurized. The process gas including the plasma generation gas, such as Ar, oxygen, or the like and the source gas, such as the CF-based gas, the CFH-based gas, or the like, is introduced from the gas supply source 50 into the processing container 2.

The process gases are introduced into the processing container 2 at the same time from the introducing units 55 and 56 formed on the ceiling surface and the inner side surface of the processing container 2. A ratio of the amounts of the process gases introduced from the introducing units 55 and 56 is adjusted by the splitter 51 in such a way that a uniform etching process is performed on the entire surface of the wafer W.

Also, according to an operation of the microwave supply device 35, an electric field is generated in the lower surface of the dielectric window 16, and thus the process gas is plasmatized and an etching process is performed on the surface of the wafer W by active species generated at that time. Also, after the etching process is performed for a predetermined period of time, the operation of the microwave supply device 35 and the supply of the process gas into the processing container 2 are stopped, and the wafer W is transferred from the processing container 2. Thus, a series of the plasma etching processes are completed.

However, in the above-described plasma processing apparatus 1, since the process gas is plasmatized, a carbon-based product may be easily adhered to the gas ejection holes 66 of the injector block 60, especially in the introducing unit 55 formed on the ceiling surface of the processing container 2. Also, when the gas ejection holes 66 are blocked by the adhered product, the process gas is unable to be smoothly introduced to the processing container 2. Moreover, uniformity of the etching with respect to the surface of the wafer W is in disorder because a balance between the amounts of the process gases introduced from the introducing unit 56 on the inner side surface of the processing container 2 and the introducing unit 55 on the ceiling surface of the processing container 2 is changed.

Figure 7:
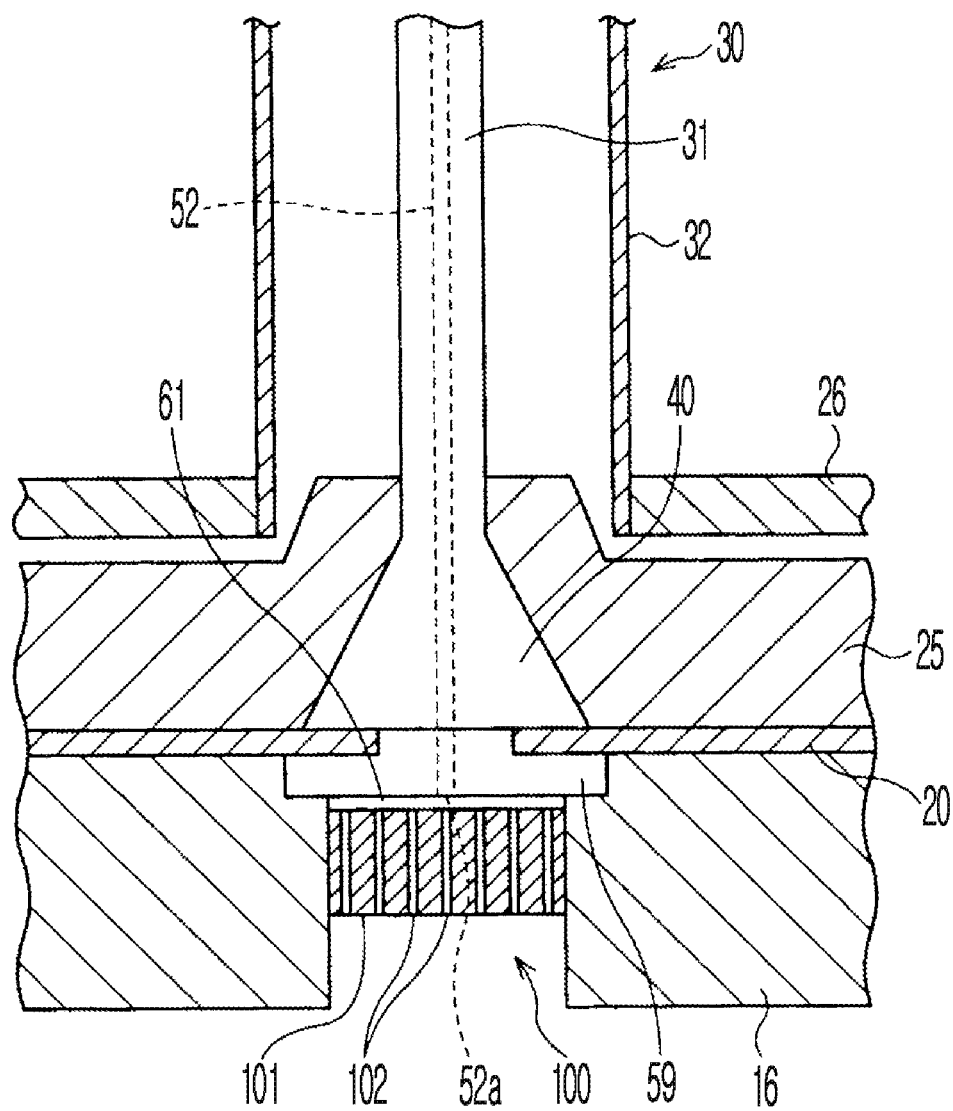
FIG. 7 is a magnified cross-sectional view of a conventional introducing unit for introducing a process gas.

Here, a main cause of generation of a carbon-based deposition in a gas ejection hole was examined with respect to a conventional introducing unit for introducing a process gas. As shown in FIG. 7, a well known structure of a conventional introducing unit 100 for introducing a process gas is formed by providing a plurality of gas ejection holes 102 on the entire area of an injector block 101 having a cylindrical shape. Each of the gas ejection holes 102 has a circular cross-sectional shape having a diameter of about 0.5 mm. An upper surface of the injector block 101 is a flat surface, and a portion corresponding to the recess portion 65 does not exist. Also, the plurality of gas ejection holes 102 are provided uniformly on the entire lower surface of the injector block 101 and are opened, and the gas ejection hole 102 is also formed in a location facing the opening 52a of the lower surface center of the inner conductor 31.

In such a conventional introducing unit 100 for introducing the process gas, since a cross-sectional area of each of the gas ejection holes 102 is small, a resistance was large and an internal pressure of the gas retention portion 61 was high when the process gas supplied from the supply passage 52 to the gas retention portion 61 passes through the gas ejection holes 102. Also, it was guessed that, when the process gas is retained tentatively at a high concentration in the gas retention portion 61, electrons or the like in the processing container 2 enter into the gas retention portion 61 via the gas ejection holes 102, the process gas is plasmatized in the gas ejection holes 102, and thus the carbon-based product is adhered to the gas ejection holes 66a.

Also, in the conventional introducing unit 100 for introducing the process gas, the process gas intensively flew into the gas ejection hole 102 in the location facing the opening 52a of the lower surface center of the inner conductor 31, and an inflow amount of the process gas was low in the gas ejection holes 102 deviated from the opening 52a of lower surface center of the inner conductor 31 (the lower surface center of the supporting block 59). Thus, it was difficult to effectively reduce the internal pressure of the gas retention portion 61 even though the number of gas ejection holes 102 was increased. Also, it is difficult to evenly form the plurality of gas ejection holes 102 each having a diameter of about 0.5 mm.

In the plasma processing apparatus 1 according to the present embodiment, however, since the gas ejection holes 66 formed on the injector block 60 of the introducing unit 55 have flat cross-sectional shapes, the length L of the circumferential direction is sufficiently long compared to the diameter (about 0.5 mm) of each of the conventional gas ejection holes 102. Thus, according to the plasma processing apparatus 1 of the present embodiment, the cross-sectional areas of the gas ejection holes 66 are considerably large compared to those of a related art, and the process gas easily gets out from the gas retention portion 61 into the processing container 2. Accordingly, the internal pressure of the gas retention portion 61 is decreased, and thus a concentration of the process gas in the gas retention portion 61 is also decreased. The gas ejection hole is not formed through the gas retention portion 61, and thus it is difficult to plasmatize the process gas by electrons or the like. As a result, for example, even when the electrons or the like in the processing container 2 enter the gas retention portion 61 from the gas ejection holes 102, a possibility of the process gas to be plasmatized in the gas ejection holes 102 is decreased, and thus the carbon-based product is prevented from being adhered to the gas ejection holes 66.

Also, in the plasma processing apparatus 1 according to the present embodiment, no gas ejection holes 66 are formed at the location facing the opening 52a of the lower surface center of the inner conductor 31 (the lower surface center of the supporting block 59), and the plurality of gas ejection holes 66 are all disposed around the recess portion 65. Thus, the process gas supplied from the supply passage 52, which penetrates the center of the inner conductor 31, to the gas retention portion 61 spreads from the center of the gas retention portion 61 to the periphery of the gas retention portion 61, and then flows into each of the gas ejection holes 66. Accordingly, the process gas flows into the plurality of gas ejection holes 66 in almost the same state (pressure), thereby effectively reducing the internal pressure of the gas retention portion 61. In this case, since the recess portion 65 is formed in the center of the upper surface of the injector block 60, a force (inertia) of the process gas that has flowed through the supply passage 52 is remarkably reduced when the process gas flows into the recess portion 65. As a result, the process gas supplied form the supply passage 52 to the gas retention portion 61 uniformly spreads on the entire region of the gas retention portion 61, and is thus introduced from all of the gas ejection holes 66 formed in the injector block 60 into the processing container 2. Accordingly, the internal pressure of the gas retention portion 61 is more effectively decreased, and thus the concentration of the process gas in the gas retention portion 61 is decreased and the carbon-based product is more prevented from being adhered to the gas ejection holes 66.

Also, in the plasma processing apparatus 1 according to the present embodiment, all of the plurality of gas ejection holes 66 are not directly seen from the inside of the processing container 2 by being covered by the dielectric window 16, when viewed upward from the inside of the processing container 2. Accordingly, it is difficult for the electrons or the like generated inside the processing container 2 to enter the gas ejection holes 66, and thus it is difficult for the carbon-based deposition to be generated in the gas ejection holes 66.

Also, the injector block 60 is formed of a conductive material such as aluminum or the like, and is electrically grounded. Thus, even when the electrons enter the gas ejection holes 66, the electrons contact the inner wall surfaces of the gas ejection holes 66, and thus are easily trapped. At this time, since the width t of each of the gas ejection holes 66 is narrow, for example, about 0.5 mm, a possibility of the electrons to reach the gas retention portion 61 without contacting the inner wall surfaces of the gas ejection holes 66 is very low.

Also, the lower surface of the injector block 60 is protected by the protective film 67 formed of yttria or the like on the lower surface of the injector block 60. In this case, since the protective film 67 is also formed on the periphery 66a of the tapered opening of each of the gas ejection holes 66, the opening of each of the gas ejection holes 66 is protected from a gas. Also, since the opening of each of the gas ejection holes 66 is formed in the tapered shape, the protective film 67 may be easily formed on the periphery 66a of the opening.

Accordingly, according to the plasma processing apparatus 1 of the present embodiment, the process gas is smoothly introduced to the processing container 2. Also, the etching is more uniformly performed on the surface of the wafer W since the balance between the amounts of the process gases introduced from the introducing unit 55 on the ceiling surface of the processing container 2 and the introducing unit 56 on the inner side surface of the processing container 2 is satisfactorily maintained. Also, an operation of resolving blocking of the gas ejection holes 66 is diminished, and thus maintenanceability is improved.

While this invention has been particularly shown and described with reference to exemplary embodiments thereof, the invention is not limited to those examples. It will be understood by one of ordinary skill in the art that various changes in form and details may be made therein without departing from the spirit and scope of the invention as defined by the appended claims.

For example, an alumite process may be performed on the upper surface of the injector block 60 or inner surfaces of the gas ejection holes 66, thereby improving durability of the upper surface of the injector block 60 or the inner surfaces of the gas ejection holes 66. In this case, a periphery of an entrance portion of each of the gas ejection holes 66, which is shown on the upper surface of the injector block 60, may have a tapered shape. Sizes of the plurality of gas ejection holes 66 formed in the injector block 60 may be the same as or different from each other. Also, the plurality of gas ejection holes 66 may be arranged, for example, in a spiral shape.

Although the embodiments of the present invention are applied to the plasma processing apparatus 1 for performing the etching process, the present invention may be applicable to plasma processing apparatuses that perform a substrate process other than the etching process, for example, a film-forming process. Also, a substrate that is processed by a plasma processing apparatus according to the present invention may be a semiconductor wafer, an organic EL substrate, a FPD (flat panel display) substrate, or the like.

EMBODIMENTS

A relationship between a cross-sectional shape of a gas ejection hole formed in an injector block and an internal pressure of a gas retention portion is examined.

Comparative Example 1

Conventional Example

Figure 8:
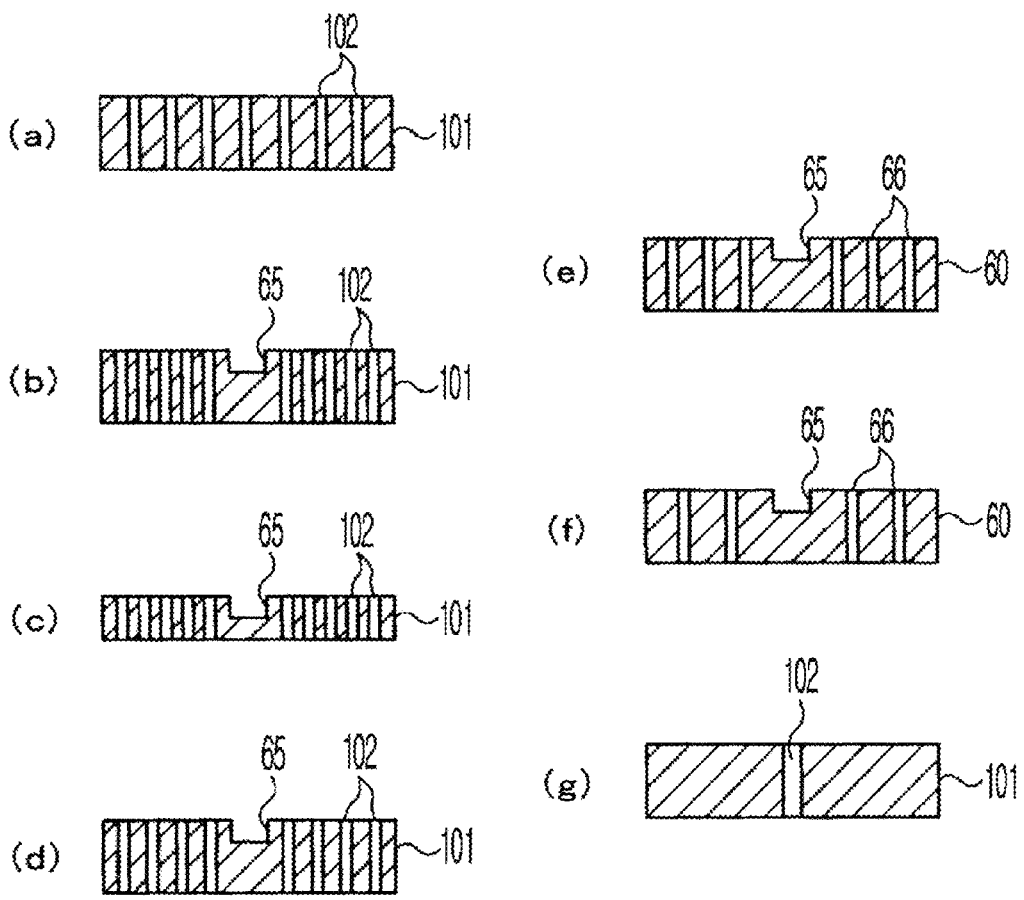
FIG. 8 is a view for explaining injector blocks of Comparative Examples 1 through 5 and Embodiments 1 and 2.

As shown in FIG. 8(*a*), in Comparative Example 1, 19 gas ejection holes 102 each having a circular cross-sectional shape with a diameter of 0.5 mm are formed in the injector block 101 having a disc shape with a thickness of 8 mm. The gas ejection hole 102 is formed even on the center of the injector block 101, which is a location facing an opening of a supply passage of a process gas. The upper surface of the injector block 101 is flat and has no recess portion.

Comparative Example 2

As shown in FIG. 8(*b*), in Comparative Example 2, 324 gas ejection holes 102 each having a circular cross-sectional shape with a diameter of 0.5 mm are formed in the injector block 101 having a disc shape with a thickness of 8 mm. No gas ejection holes 102 are formed on the center of the injector block 101, which is a location facing an opening of a supply passage of a process gas. Also, the recess portion 65 is formed in the center of the upper surface of the injector block 101.

Comparative Example 3

As shown in FIG. 8(c), in Comparative Example 3, 324 gas ejection holes 102 each having a circular cross-sectional shape with a diameter of 0.5 mm are formed in the injector block 101 having a disc shape with a thickness of 4 mm. No gas ejection holes 102 are formed on the center of the injector block 101, which is a location facing an opening of a supply passage of a process gas. Also, the recess portion 65 is formed in the center of the upper surface of the injector block 101.

Comparative Example 4

As shown in FIG. 8(d), in Comparative Example 4, 48 gas ejection holes 102 each having a circular cross-sectional shape with a diameter of 0.5 mm are formed in the injector block 101 having a disc shape with a thickness of 8 mm. No gas ejection holes 102 are formed on the center of the injector block 101, which is a location facing an opening of a supply passage of a process gas. Also, the recess portion 65 is formed in the center of the upper surface of the injector block 101.

Comparative Example 5

As shown in FIG. 8(g), in Comparative Example 5, only one gas ejection hole 102 having a circular cross-sectional shape with a diameter of 2.5 mm is formed on the center of the injector block 101 having a disc shape with a thickness of 8 mm. The gas ejection hole 102 is formed on a location facing an opening of a supply passage of a process gas. The upper surface of the injector block 101 is flat and has no recess portion.

Differences between internal pressures of gas retention portion and internal pressures of processing containers were measured with respect to the injector blocks of Comparative Examples 1 through 5 and Embodiments 1 and 2. The measurement was performed while flowing an Ar gas at 100 mtorr and 100 sccm. Results of measuring the internal pressures of the gas retention portions and the internal pressures of the processing containers of Comparative Examples 1 through 5 and Embodiments 1 and 2 are shown in Table 1.

TABLE 1

| | Comparative Example 1 | Comparative Example 2 | Comparative Example 3 | Comparative Example 4 | Comparative Example 5 | Embodiment 1 | Embodiment 2 |
|---|---|---|---|---|---|---|---|
| Gas retention portion | 650 Pa 4.9 T | 550 Pa 4.1 T | 350 Pa 2.6 T | 1230 Pa 9.5 T | 400 Pa 3 T | 280 Pa 2.1 T | 250 Pa 1.87 T |
| Processing Container | 50 Pa 375 mT | 50 Pa 375 mT | 32 Pa 240 mT | 37 Pa 277 mT | 35 Pa 260 mT | 35 Pa 260 mT | 33 Pa 247 mT | shape with a diameter of 0.5 mm are formed in the injector block 101 having a disc shape with a thickness of 8 mm. No gas ejection holes 102 are formed on the center of the injector block 101, which is a location facing an opening of a supply passage of a process gas. Also, the recess portion 65 is formed in the center of the upper surface of the injector block 101.

Embodiment 1

As shown in FIG. 8(e), in Embodiment 1, 24 gas ejection holes 66 each having a flat cross-sectional shape are formed in the injector block 60 having a disc shape with a thickness of 8 mm. The width t of the gas ejection hole 66 in the radial direction of the injector block 60 is 0.5 mm, and the length L thereof in the circumferential direction of the injector block 60 is from several mm to ten and several mm. No gas ejection holes 66 are formed on the center of the injector block 60, which is a location facing an opening of a supply passage of a process gas. Also, the recess portion 65 is formed in the center of the upper surface of the injector block 60.

Embodiment 2

As shown in FIG. 8(f), in Embodiment 2, 12 gas ejection holes 66 each having a flat cross-sectional shape are formed in the injector block 60 having a disc shape with a thickness of 8 mm. The width t of the gas ejection hole 66 in the radial direction of the injector block 60 is 0.5 mm, and the length L thereof in the circumferential direction of the injector block 60 is from several mm to ten and several mm. No gas ejection holes 66 are formed on the center of the injector block 60, which is a location facing an opening of a supply passage of a process gas. Also, the recess portion 65 is formed in the center of the upper surface of the injector block 60.

From the results of Table 1, the differences between the internal pressures of the gas retention portions and the internal pressures of the processing containers are small in the injector blocks of Embodiments 1 and 2 compared to the injector blocks of Comparative Examples 1 through 5.

Figure 9:
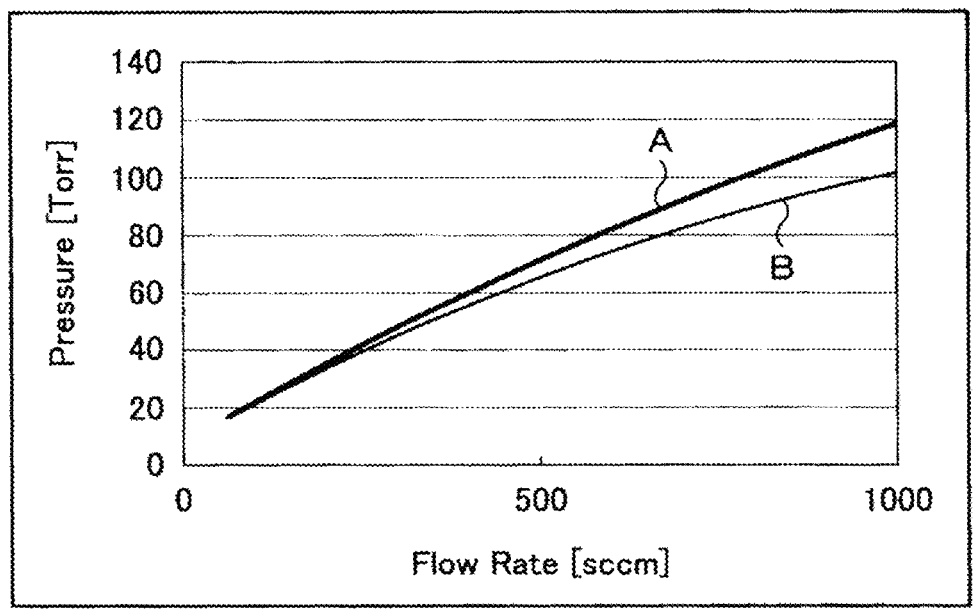
FIG. 9 is a graph showing a relationship between pressures in splitters of Comparative Example 1 and Embodiment 1, and a flow rate of a process gas.
Figure 10:
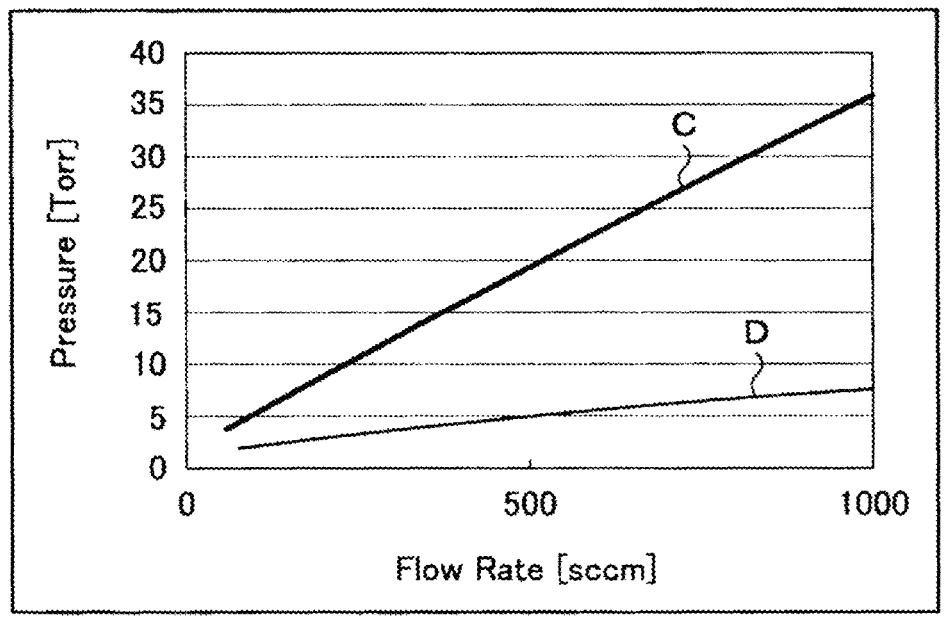
FIG. 10 is a graph showing a relationship between internal pressures in gas retention portions of Comparative Example 1 and Embodiment 1, and a flow rate of a process gas.

Next, flow rates for the injector blocks of Comparative Example 1 and Embodiment 1 are changed to measure changes of the internal pressures of the gas retention portions. The flow rate of the Ar gas (100 mtorr) was changed to 50 to 1000 sccm. The results are shown in FIGS. 9 and 10. As shown in FIG. 9, in a splitter operating as a supplier, a pressure A of Comparative Example 1 and a pressure B of Embodiment 1 were increased almost proportionally. Here, as shown in FIG. 10, an internal pressure D of the gas retention portion of Embodiment 1 was almost constant regardless of the increase of the flow rate. Meanwhile, an internal pressure C of the gas retention portion of Comparative Example 1 was increased in proportion to the increase of the flow rate.

According to the present invention, generation of a carbon-based deposition in an introducing unit for introducing a process gas to a processing container can be suppressed. Accordingly, in a plasma processing apparatus that processes a substrate by plasmatizing the process gas introduced to the processing container, the process gas is smoothly introduced to the processing container. Also, uniformity of etching on a surface of the substrate is improved since a balance between amounts of process gases introduced from an introducing unit on a side surface and an introducing unit on a ceiling surface is satisfactorily maintained. Also, an operation of resolving blocking of a gas ejection hole is diminished, and thus maintenanceability is improved.

The present invention is useful, for example, in semiconductor manufacturing fields.

What is claimed is:

1. A plasma processing apparatus which processes a substrate by plasmatizing a process gas introduced into a processing container comprising:

a dielectric window disposed at a ceiling of the processing container;

an introducing unit disposed in the dielectric window, the introducing unit having a gas supply passage;

an opening formed at an end of the gas supply passage;

an injector block disposed under the opening with a gap between the opening and the injector block, the gap forming a gas retention portion retaining the process gas introduced through the opening, wherein the opening is positioned above the center of the injector block;

a plurality of gas ejection holes formed in the injector block except for a region directly under the opening;

a recess formed in the region of the injector block directly under the opening to buffer the process gas exiting from the opening; and a gas passageway formed by the dielectric window under the injector block, the gas passageway having a diameter configured to become gradually smaller towards inside the processing container so that the gas ejection holes are covered by the dielectric window and therefore, the gas election holes do not directly face the substrate when viewed vertically upward from inside the processing container, wherein the process gas retained in the gas retention portion flows through the gas ejection holes and then the gas passageway to inside the processing container.

2. The plasma processing apparatus of claim 1, wherein the plurality of gas ejection holes are disposed in a circumferential direction around the recess.

3. The plasma processing apparatus of claim 2, wherein each of the gas ejection holes has a cross-sectional shape from a top view that is long in the circumferential direction and short in a radial direction.

4. The plasma processing apparatus of claim 3, wherein each of the gas ejection holes has a width of 1 mm or less in the radial direction and a length of several mm to ten and several mm in the circumferential direction.

5. The plasma processing apparatus of claim 1, wherein the injector block is formed of a conductive material, and is electrically grounded.

6. The plasma processing apparatus of claim 5, wherein a protective film which increases detachability is formed on a surface of the injector block that faces the inside of the processing container.

7. The plasma processing apparatus of claim 6, wherein a periphery of the opening of the gas ejection hole that faces the inside of the processing container has a tapered shape.

8. The plasma processing apparatus of claim 1, wherein a cross section of each of the gas ejection holes from a top view has a width and a length in which the width of the cross section is not identical to the length of the cross section.

* * * * *